(12) United States Patent
Liu et al.

(10) Patent No.: US 7,064,078 B2
(45) Date of Patent: Jun. 20, 2006

(54) TECHNIQUES FOR THE USE OF AMORPHOUS CARBON (APF) FOR VARIOUS ETCH AND LITHO INTEGRATION SCHEME

(75) Inventors: Wei Liu, San Jose, CA (US); Jim Zhongyi He, Sunnyvale, CA (US); Sang H. Ahn, Foster City, CA (US); Meihua Shen, Fremont, CA (US); Hichem M'Saad, Santa Clara, CA (US); Wendy H. Yeh, Mountain View, CA (US); Chistopher D. Bencher, San Jose, CA (US)

(73) Assignee: Applied Materials, Santa Clara, CA (US)

( * ) Notice: Subject to any disclaimer, the term of this patent is extended or adjusted under 35 U.S.C. 154(b) by 168 days.

(21) Appl. No.: 10/768,724

(22) Filed: Jan. 30, 2004

(65) Prior Publication Data

US 2005/0167394 A1 Aug. 4, 2005

(51) Int. Cl.
*H01L 21/302* (2006.01)

(52) U.S. Cl. ............... 438/717; 438/723; 438/724; 216/41; 216/58; 216/67; 216/72; 216/75; 216/79; 216/81

(58) Field of Classification Search .............. None
See application file for complete search history.

(56) References Cited

U.S. PATENT DOCUMENTS

| | | | |
|---|---|---|---|
| 5,022,959 A | 6/1991 | Itoh et al. | |
| 5,308,741 A | 5/1994 | Kemp | |
| 5,674,573 A | 10/1997 | Mitani et al. | |
| 5,786,115 A | 7/1998 | Kawabata et al. | |
| 5,830,332 A | 11/1998 | Babich et al. | |
| 5,998,100 A | 12/1999 | Azuma et al. | |
| 6,042,993 A | 3/2000 | Leuschner et al. | |
| 6,080,529 A | 6/2000 | Ye et al. | |
| 6,140,226 A * | 10/2000 | Grill et al. | ............. 438/637 |
| 6,143,476 A | 11/2000 | Ye et al. | |
| 6,184,572 B1 | 2/2001 | Mountsier et al. | |
| 6,214,637 B1 | 4/2001 | Kim et al. | |
| 6,238,850 B1 | 5/2001 | Bula et al. | |
| 6,316,167 B1 | 11/2001 | Angelopoulos et al. | |
| 6,331,380 B1 | 12/2001 | Ye et al. | |
| 6,352,922 B1 | 3/2002 | Kim | |
| 6,423,384 B1 | 7/2002 | Khazeni et al. | |
| 6,458,516 B1 | 10/2002 | Ye et al. | |
| 6,483,571 B1 | 11/2002 | Shiraishi | |

(Continued)

FOREIGN PATENT DOCUMENTS

DE  103 28 578  2/2004

(Continued)

OTHER PUBLICATIONS

Wolf, Silicon Processing for the VLSI Era, 2002, Lattice Press, vol. 4, pp. 244-245, 249-250, 639, 679-680.*

(Continued)

*Primary Examiner*—Nadine G. Norton
*Assistant Examiner*—Eric B. Chen
(74) *Attorney, Agent, or Firm*—Patterson and Sheridan

(57) ABSTRACT

A method of etching a substrate is provided. The method of etching a substrate includes transferring a pattern into the substrate using a double patterned amorphous carbon layer on the substrate as a hardmask. Optionally, a non-carbon based layer is deposited on the amorphous carbon layer as a capping layer before the pattern is transferred into the substrate.

23 Claims, 4 Drawing Sheets

U.S. PATENT DOCUMENTS

| | | |
|---|---|---|
| 6,498,105 B1 | 12/2002 | Kim |
| 6,511,791 B1 | 1/2003 | Bukofsky et al. |
| 6,514,667 B1 | 2/2003 | Angelopoulos et al. |
| 6,541,397 B1 | 4/2003 | Bencher |
| 6,571,384 B1 | 5/2003 | Shin et al. |
| 6,573,030 B1 | 6/2003 | Fairbairn et al. |
| 6,611,316 B1 | 8/2003 | Sewell |
| 6,627,933 B1 | 9/2003 | Juengling |
| 6,653,735 B1 | 11/2003 | Yang et al. |
| 6,764,949 B1* | 7/2004 | Bonser et al. ............ 438/666 |
| 2002/0001778 A1* | 1/2002 | Latchford et al. .......... 430/313 |
| 2002/0086547 A1 | 7/2002 | Mui et al. |
| 2003/0091938 A1 | 5/2003 | Fairbaim et al. |
| 2003/0186477 A1 | 10/2003 | Bencher |
| 2003/0207207 A1 | 11/2003 | Li |
| 2004/0023475 A1 | 2/2004 | Bonser et al. |
| 2004/0023502 A1 | 2/2004 | Tzou et al. |
| 2004/0038537 A1 | 2/2004 | Liu et al. |
| 2004/0166691 A1 | 8/2004 | Nieh et al. |
| 2004/0180551 A1 | 9/2004 | Biles et al. |

FOREIGN PATENT DOCUMENTS

| | | |
|---|---|---|
| EP | 0 381 109 | 1/1990 |
| EP | 0 901 156 | 3/1999 |
| JP | 09 045633 | 2/1997 |
| JP | 11 026578 | 1/1999 |
| WO | WO 00/05763 | 2/2000 |

OTHER PUBLICATIONS

Canon USA, "Canon Extends Lithography Roadmap: Presents Resolution Capabilities Beyond k1 or 0.25 at BACUS" http:www.usa.canon.com/templatedata/pressrelease/20030904_photomask.html (2 pages), press release dated Sep. 4, 2003.

Saleem H. Zaidi, et al. "Nonlinear Processes to Extend Interferometric Lithography" SPIE Conference on Emerging Lithographic Technologies III, Mar. 1999, SPIE vol. 3676, pp. 371-378.

Brian Tyrrell, et al. "Investigation of the Physical and Practical Limits of Dense-Only Phase Shift Lithography for Circuit Feature Definition" J. Microlith., Microfab., Microsyst., vol. 1 No. 3, Oct. 2002.

Takeaki Ebihara, et al. "Beyond $k_1$=0.25 lithography: 70nm L/S patterning using KrF scanners" Proc. SPIE 5256-105, 10 pages, Dec. 2003.

Takeaki Ebihara, et al. "150nm Dense/Isolated Contact Hole Study with Canon IDEAL Technique" 21st Annual BACUS Symposium on Photomask Technology, Proceeding of SPIE vol. 4562, Apr. 2002, pp. 1068-1076.

PCT International Search Report and Written Opinion dated Jun. 8, 2005 (AMAT/8736.PC).

Wei Liu, et al., "Generating Sub-30nm Poly-Silicon Gate Using PECVD Amorphous Carbon as Hardmask and Anti-Reflective Coating" Proceeding of SPIE, (2003) vol. 4050, pp. 841-848.

PCT Notification of Transmittal of the International Search Report dated May 31, 2005 for PCT/US05/008070. (AMAT/8245PCT).

PCT Written Opinion dated May 31, 2005 for PCT/US05/008070. (AMAT/8245PCT).

* cited by examiner

TECHNIQUES FOR THE USE OF AMORPHOUS CARBON (APF) FOR VARIOUS ETCH AND LITHO INTEGRATION SCHEME

BACKGROUND OF THE INVENTION

1. Field of the Invention

Embodiments of the present invention relate to the fabrication of integrated circuits. More particularly, embodiments of the present invention relate to a process for patterning and etching features in a semiconductor substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 µm and even 0.1 µm feature sizes, and tomorrow's facilities soon will be producing devices having even smaller feature sizes.

The continued reduction in device geometries has generated a demand for methods of forming nanometer scale features that are separated by nanometer scale distances on semiconductor substrates. As the limits of optical resolution are being approached in current lithography processes, one method that has been developed to reduce the distance between features or devices on a substrate includes a double patterning of a hardmask layer that is used to transfer a pattern into the substrate. In the double patterning method, a hardmask layer is deposited on a substrate layer that is to be etched. The hardmask layer is patterned by a photoresist deposited on the hardmask layer. The photoresist is then removed, and a second pattern is introduced into the hardmask layer with a second photoresist that is deposited on the hardmask layer.

While current double patterning methods can be used to reduce the distance between features on a substrate, there remains a need for materials that can be used as hardmasks for double patterning methods. In particular, there is a need for double patterning hardmask layers that act as anti-reflective coatings that minimize reflections that can damage resolution during lithography. FIG. 1 (prior art) shows an example of a substrate 10 having features 12, 14 that were patterned at a low resolution. There is also a need for double patterning hardmask layers that have a good etch selectivity to the underlying substrate that is to be etched and are easily removable after the substrate is etched.

SUMMARY OF THE INVENTION

Embodiments of the present invention provide a method of etching a substrate comprising depositing an amorphous carbon layer on the substrate, defining a first pattern in the amorphous carbon layer, depositing a layer of photoresist on the amorphous carbon layer, patterning the photoresist, transferring the pattern in the photoresist through the amorphous carbon layer to form a second pattern in the amorphous carbon layer, and transferring the first and second patterns in the amorphous carbon layer through the substrate.

In one aspect, a method of etching a substrate comprises depositing an amorphous carbon layer on the substrate, depositing a non-carbon based layer on the amorphous carbon layer, depositing a layer of photoresist on the amorphous carbon layer, depositing a layer of photoresist on the amorphous carbon layer, depositing a layer of photoresist on the amorphous carbon layer, patterning the photoresist, transferring the pattern in the photoresist through the non-carbon based layer and the amorphous carbon layer to form a second pattern in the amorphous carbon layer, and transferring the first and second patterns in the amorphous carbon layer through the substrate.

In another aspect, a method of etching a substrate comprises depositing an amorphous carbon layer on the substrate, depositing a first non-carbon based layer on the amorphous carbon layer, defining a first pattern in the non-carbon based layer and in the amorphous carbon layer, depositing a second non-carbon based layer on the amorphous carbon layer, depositing a layer of photoresist on the second non-carbon based layer, patterning the photoresist, transferring the pattern in the photoresist through the second non-carbon based layer and the amorphous carbon layer to form a second pattern in the amorphous carbon layer, and transferring the first and second patterns in the amorphous carbon layer through the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention provide a method of etching a substrate to form very small features, such as lines or interconnect holes, e.g., 70–75 nm lines, that are very closely spaced, e.g., 70–75 nm apart. An amorphous carbon layer is used as a hardmask layer for etching the substrate to form the very small and closely spaced features. The amorphous carbon layer is an anti-reflective coating at deep ultra-violet (DUV) wavelengths, e.g., less than about 250 nm. The amorphous carbon layer has an etch selectivity of about 10:1 to oxides and about 6:1 to polysilicon. Plasma ashing can be used to easily remove the amorphous carbon layer after it is used as a hardmask.

Figure 1:
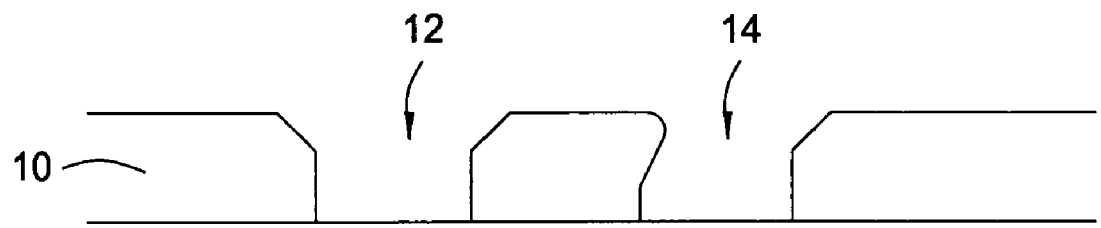
FIG. 1 is a cross sectional view of a structure processed according to the prior art.
Figure 2A:
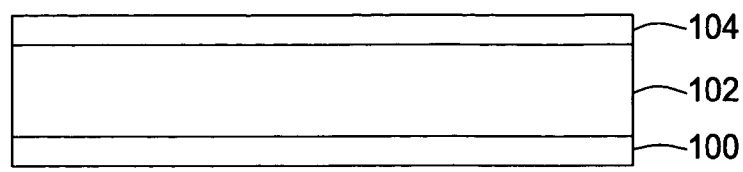
FIGS. 2A–2F are cross sectional views of a structure processed according to an embodiment of the invention.

An embodiment of the invention will now be described with respect to FIGS. 2A–2F. An amorphous carbon layer 104 is deposited on a substrate 102, as shown in FIG. 2A. The substrate 102 may be or include a material selected from the group consisting of silicon, polysilicon, an oxide, a nitride, tungsten, tungsten silicide, aluminum, silicon oxycarbide, and combinations thereof. The substrate 102 may be overlying an underlayer 100. The underlayer 100 may be an etch stop for substrate 102 during the etching of the substrate 102. Optionally, an anti-reflective coating layer selected from the group consisting of amorphous silicon, silicon nitride, silicon oxynitride, silicon oxide, doped silicon oxide, silicon oxycarbide, carbides, silicon carbide, titanium, and titanium nitride may be deposited on the substrate 102 before the amorphous carbon layer 104 is deposited on the substrate. The anti-reflective coating layer material is selected such that there is a good etch selectivity between the anti-reflective coating layer and the substrate.

The amorphous carbon layer 104 may be deposited by a variety of methods, such as chemical vapor deposition, plasma enhanced chemical vapor deposition, high density plasma chemical vapor deposition, or combinations thereof. The amorphous carbon layer may include carbon and hydrogen or carbon, hydrogen, and a dopant, such as nitrogen, boron, fluorine, phosphorus, or mixtures thereof, among others.

In one embodiment, the amorphous carbon layer is formed from a gas mixture of a hydrocarbon compound and an inert gas such as argon, helium, xenon, krypton, neon, or combinations thereof. Preferably, the carbon source is a gaseous hydrocarbon, such as a linear hydrocarbon. In one embodiment, the hydrocarbon compound has a general formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$) as well as combinations thereof, may be used as the hydrocarbon compound. Similarly, a variety of gases such as hydrogen ($H_2$), nitrogen ($N_2$), ammonia ($NH_3$), or combinations thereof, among others, may be added to the gas mixture, if desired. Ar, He, and $N_2$ may be used to control the density and deposition rate of the amorphous carbon layer. The addition of $H_2$ and/or $NH_3$ can be used to control the hydrogen ratio of the amorphous carbon layer, as discussed below.

In general, the following deposition process parameters can be used to form the amorphous carbon layer. The process parameters range from a wafer temperature of about 100° C. to about 700° C., a chamber pressure of about 1 torr to about 20 torr, a hydrocarbon gas flow rate of about 50 sccm to about 500 sccm (per 8 inch wafer), a RF power of between about 1 W/in$^2$ and about 100 W/in$^2$, such as between about 3 W/in$^2$ and about 20 W/in$^2$, and a plate spacing of between about 300 mils to about 600 mils. Preferably, the amorphous carbon layer is deposited to a thickness between about 400 Å and about 10,000 Å, such as about 500 Å. The above process parameters provide a typical deposition rate for the amorphous carbon layer in the range of about 100 Å/min to about 5,000 Å/min and can be implemented on a 200 mm substrate in a deposition chamber available from Applied Materials, Inc. of Santa Clara, Calif. An example of a deposition chamber that may be used is an APF™ chamber on the Producer® system, available from Applied Materials, Inc.

Other deposition chambers are within the scope of the invention and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc.

The as-deposited amorphous carbon layer has an adjustable carbon:hydrogen ratio that ranges from about 10% hydrogen to about 60% hydrogen. Controlling the hydrogen ratio of the amorphous carbon layer is desirable for tuning its optical properties as well as its etch selectivity. Specifically, as the hydrogen ratio decreases, the optical properties of the as-deposited layer such as for example, the absorption coefficient (k) increases. Similarly, as the hydrogen ratio decreases, the etch resistance of the amorphous carbon layer may increase, depending on the etch chemistry used.

The light absorption coefficient, k, of the amorphous carbon layer can be varied between about 0.1 to about 1.0 at wavelengths below about 250 nm, making it suitable for use as an anti-reflective coating (ARC) at DUV wavelengths. The absorption coefficient of the amorphous carbon layer can be varied as a function of the deposition temperature. In particular, as the temperature increases the absorption coefficient of the as-deposited layer likewise increases. For example, when propylene is the hydrocarbon compound used to deposit the amorphous carbon layer, the k value for the as-deposited amorphous carbon layers can be increased from about 0.2 to about 0.7 by increasing the deposition temperature from about 150° C. to about 480° C. Preferably, the amorphous carbon layer absorbs less than 50% of light having a wavelength of between about 450 nm and about 700 nm, as semiconductor substrates are typically aligned with alignment marks and inspected using wavelengths between about 450 nm and about 700 nm.

The absorption coefficient of the amorphous carbon layer can also be varied as a function of an additive used in the gas mixture. In particular, the presence of $H_2$, $NH_3$, $N_2$ or combinations thereof in the gas mixture can increase the k value by about 10% to about 100%.

In another embodiment, the amorphous carbon layer is deposited from a gas mixture comprising a hydrocarbon compound by a high density plasma chemical vapor deposition method (HDP-CVD). A preferred hydrocarbon gas is methane ($CH_4$). However, other hydrocarbon gases, such as $C_2H_6$ and $C_2H_2$, as well as a mixture of hydrocarbon gases, for example a mixture of acetylene and methane may be used. Gaseous hydrocarbons and liquid hydrocarbons from the alkene group, the alkane group and the alkyne group may be used. Examples of these hydrocarbons include $CH_4$, $C_2H_2$, $C_2H_4$, $C_2H_6$, and $C_2H_8$.

The hydrocarbon gas is introduced into a HDP-CVD chamber along with a carrier gas such as argon. An example of a HDP-CVD chamber that may be used is an Ultima HDP-CVD chamber on a Centura® system available from Applied Materials, Inc. An example of a HDP-CVD chamber is further described in U.S. Pat. No. 6,423,384, which is incorporated by reference herein. Preferably, the hydrocarbon gas is introduced into the chamber through a first set of gas nozzles at a flow rate of between about 10 sccm and about 500 sccm, and the carrier gas is introduced into the chamber through a second set of gas nozzles at a flow rate of between about 5 sccm and about 300 sccm. In one preferred embodiment, the hydrocarbon gas is introduced into the chamber at a flow rate of about 125 sccm, and argon gas is introduced into the chamber at a flow rate of about 27 sccm. The preferred ratio of the flow rate of the hydrocarbon gas to the flow rate of the carrier gas is between about 2:1 and about 5:1. Although the hydrocarbon gas and the carrier gas are preferably introduced into the chamber through separate gas nozzles, the hydrocarbon gas and the carrier gas may be premixed before they are introduced into the chamber.

Preferably, the chamber pressure during processing is maintained between about 10 mTorr and about 100 mTorr, such as at about 20 mTorr. The source plasma power applied to the chamber to generate and maintain a plasma of the processing gas, including both the hydrocarbon gas and the carrier gas, is preferably an RF power at about 2 MHz and at less than 2000 W, such as at about 1000 W, for a 200 mm substrate. The power applied is adjusted according to size of the substrate being processed. Preferably, the substrate is maintained at between about 300° C. and about 430° C. during the deposition process, and the backside of the substrate is cooled by the helium gas in channels within the electrostatic chuck. Preferably, the substrate bias power is inactivated during the deposition process. After the deposition process, the substrate may be transferred into an anneal chamber without breaking vacuum, and an optional anneal step may be conducted in the anneal chamber at a temperature between about 300° C. and about 430° C. for between about 30 minutes and about 90 minutes in a vacuum or in an inert gas environment. In one embodiment, the deposited substrate is annealed in a nitrogen environment for about 30 minutes.

Figure 2B:
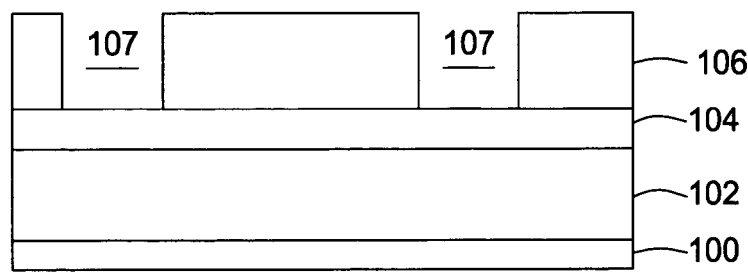
Figure 2C:
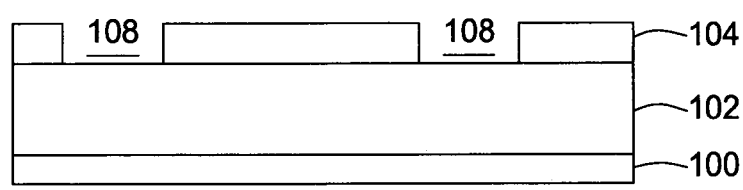
Figure 2D:
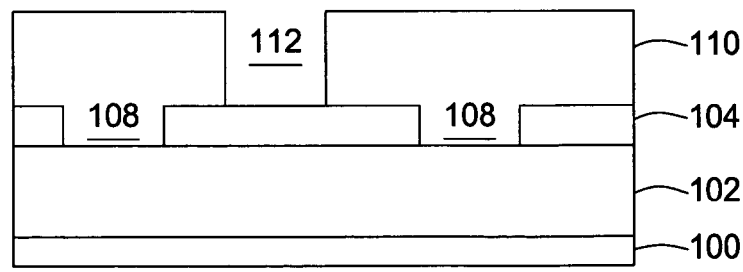
Figure 2E:
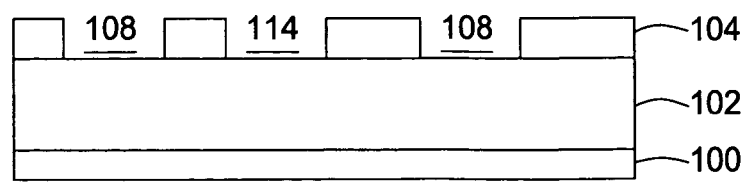
Figure 2F:
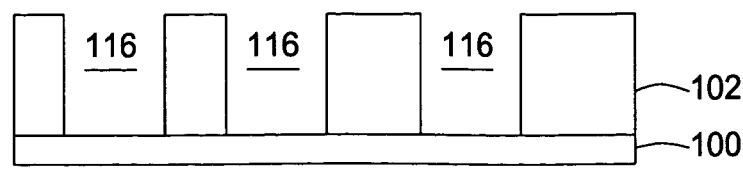

After the amorphous carbon layer 104 is deposited on the substrate 102, the amorphous carbon layer 104 is patterned to include features 108 therein, as shown in FIG. 2C. The amorphous carbon layer 104 may be patterned by depositing and patterning a photoresist 106 on the amorphous carbon layer 104, as shown in FIG. 2B. The features 107 patterned in the photoresist 106 are transferred to the amorphous carbon layer 104 to create features 108 in the amorphous carbon layer 104, and the photoresist 106 is removed, as shown in FIG. 2C. A photoresist 110 is then deposited on the amorphous carbon layer and is patterned to include feature 112, as shown in FIG. 2D. The feature 112 patterned in the photoresist 110 is transferred to the amorphous carbon layer 104 to create feature 114 in the in the amorphous carbon layer 104, and the photoresist 110 is removed, as shown in FIG. 2E. The amorphous carbon layer 104 may be patterned by etching the layer with a plasma of oxygen, hydrogen, a fluorine containing gas such as $NF_3$, $SF_6$, $CF_4$, or combinations thereof. Optionally, the plasma may further comprise HBr, $N_2$, He, Ar, or combinations thereof. The features 108 and 114 patterned in the amorphous carbon layer are then transferred through the substrate using the amorphous carbon layer as a hardmask to form features 116 in the substrate, as shown in FIG. 2F. The substrate may be patterned by exposing the substrate to an etchant appropriate for the composition of the substrate. The amorphous carbon layer may be removed from the substrate with a plasma comprising ozone, oxygen, ammonia, hydrogen, or combinations thereof after the substrate is etched.

In any of the embodiments described herein, the photoresist may be deposited, patterned, and removed using conventional techniques. For example, a layer of photoresist having a thickness of between about 2000 Å and about 6000 Å may be deposited on the substrate. Photoresists that are sensitive to UV radiation having a wavelength less than about 450 nm or deep ultra-violet radiation resists that are sensitive to radiation having wavelengths such as 248 nm or 193 nm may be used. The photoresist may be patterned by exposing the photoresist to radiation of the appropriate wavelength through a patterned mask. The photoresist may be removed by a plasma ashing process.

In another embodiment, a non-carbon based layer, such as a non-carbon based dielectric layer, is deposited on the amorphous carbon layer described above as a capping layer. As defined herein, a non-carbon based layer comprises less than about 50 atomic % carbon. Examples of non-carbon based materials that may be used include amorphous silicon, silicon nitride, silicon oxynitride, silicon oxide, doped silicon oxide, silicon oxycarbide, carbides, silicon carbide, titanium, and titanium nitride. The non-carbon based layer may protect the amorphous carbon layer during processing steps such as the removal of the photoresist. The non-carbon based layer may also act as an anti-reflective coating. The non-carbon based layer is chosen such that there is a good etch selectivity between the non-carbon based layer and the substrate underneath the amorphous carbon layer. Preferably, the non-carbon based layer has a thickness between about 50 Å and about 500 Å. Preferably, the non-carbon based layer has a thickness of at least about 200 Å.

An embodiment including a non-carbon based layer as a capping layer on the amorphous carbon layer will be described with respect to FIGS. 3A–3F. The methods described above with respect to FIGS. 2A–2F may be used to perform the corresponding steps in the embodiment described with respect to FIGS. 3A–3F and FIGS. 4A–4D.

Figure 3A:
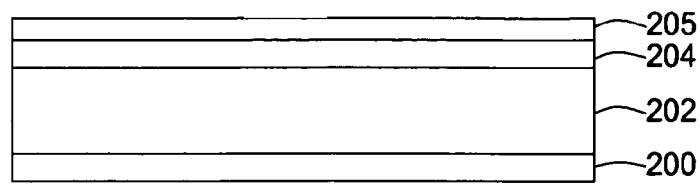
FIGS. 3A–3F are cross sectional views of a structure processed according to an embodiment of the invention.
Figure 3B:
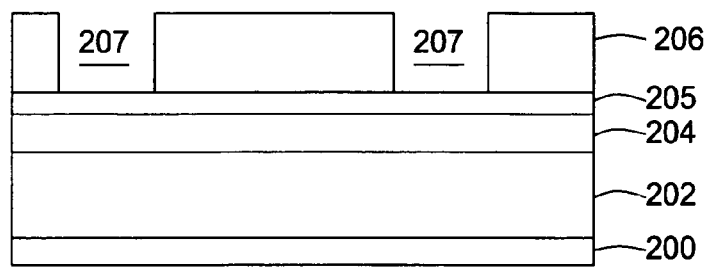
Figure 3C:
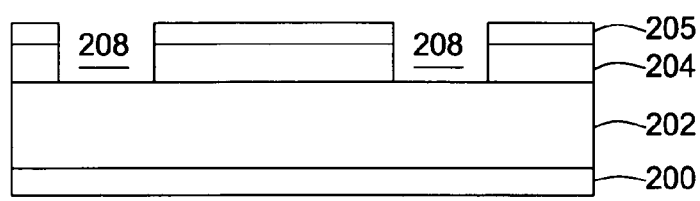
Figure 3D:
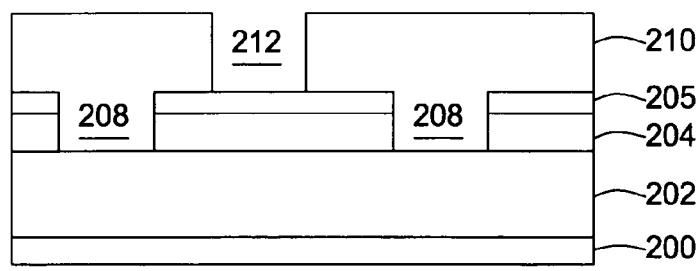
Figure 3E:
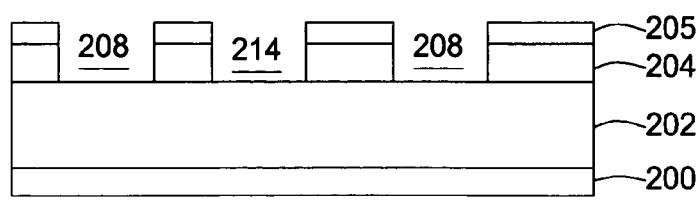
Figure 3F:
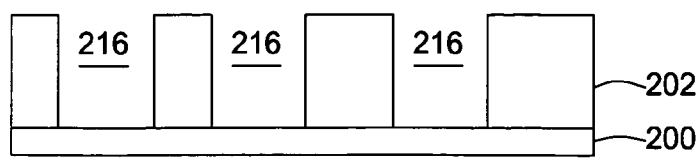

An amorphous carbon layer 204 is deposited on a substrate 202, as shown in FIG. 3A. The substrate 202 may be overlying an underlayer 200. The underlayer 200 may be an etch stop for substrate 202 during the etching of the substrate 202. A non-carbon based layer 205 is deposited on the amorphous carbon layer 204. The non-carbon based layer 205 may be deposited by conventional methods, such as chemical vapor deposition, physical vapor deposition, or spin-on processes. The amorphous carbon layer 204 and the non-carbon based layer 205 may be patterned by depositing and patterning a photoresist 206 on the non-carbon based layer 205, as shown in FIG. 3B. The features 207 patterned in the photoresist 206 are transferred to the amorphous carbon layer 204 and the non-carbon based layer 205 to create features 208 in the amorphous carbon layer 204 and the non-carbon based layer 205, and the photoresist 206 is removed, as shown in FIG. 3C. A photoresist 210 is then deposited on the amorphous carbon layer and is patterned to include feature 212, as shown in FIG. 3D. The feature 212 patterned in the photoresist 210 is transferred to the amorphous carbon layer 204 and the non-carbon based layer 205 to create feature 214 in the amorphous carbon layer 204 and the non-carbon based layer 205, and the photoresist 210 is removed, as shown in FIG. 3E. The features 208 and 214 patterned in the amorphous carbon layer are then transferred through the substrate using the amorphous carbon layer as a hardmask to form features 216 in the substrate, as shown in FIG. 3F. The non-carbon based layer may be removed while the features are being transferred through the substrate or during the removal of the amorphous carbon layer. The amorphous carbon layer may be removed from the substrate with a plasma comprising ozone, oxygen, ammonia, hydrogen, or combinations thereof.

While the non-carbon based layer 205 in the embodiment of FIGS. 3A–3F is shown and described as remaining on the substrate after the features 208 are formed in the amorphous carbon layer 204, in other embodiments, some or all of the non-carbon based layer 205 may be removed after the features 208 are formed in the amorphous carbon layer, such as during the removal of the photoresist 206. In one embodiment, a second non-carbon based layer is deposited on the substrate. The second non-carbon based layer may be deposited directly on the substrate, on the first non-carbon based layer, or on a remaining portion of the first non-carbon based layer. The second non-carbon based layer may include amorphous silicon, silicon nitride, silicon oxide, doped silicon oxide, silicon oxycarbide, carbides, silicon carbide, titanium, or titanium nitride. The second non-carbon based layer may have the same composition or a different composition than the first non-carbon based layer.

Figure 4A:
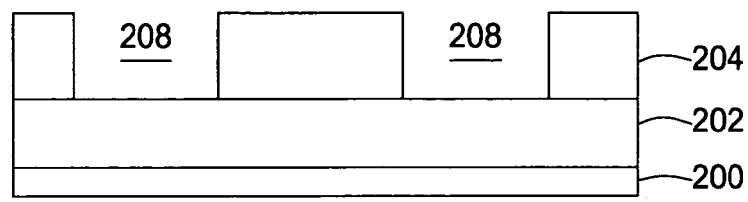
FIGS. 4A–4D are cross sectional views of a structure processed according to an embodiment of the invention.
Figure 4B:
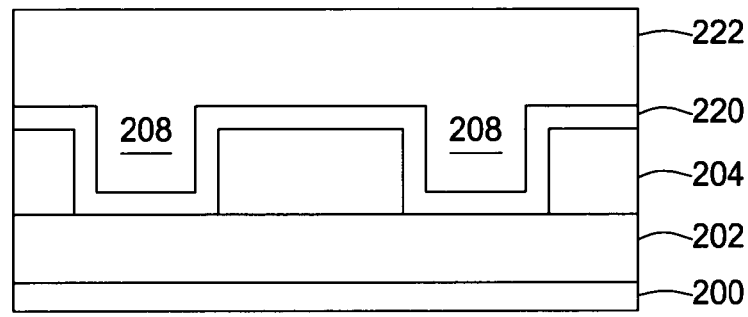
Figure 4C:
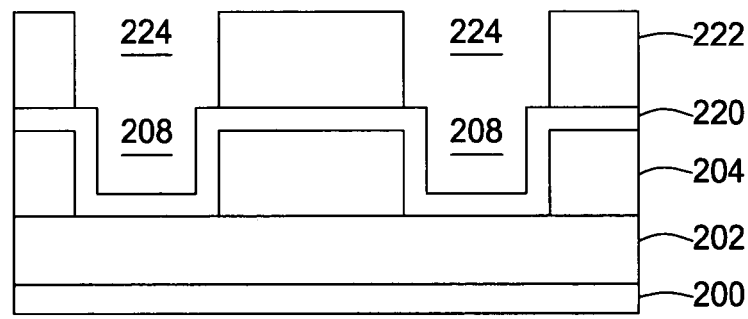
Figure 4D:
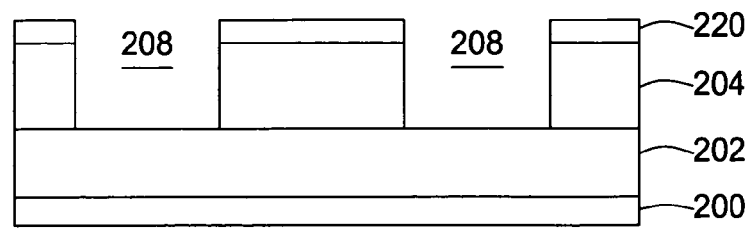

FIGS. 4A–4D show an embodiment in which all of the first non-carbon based layer 205 is removed during processing. FIG. 4A corresponds to FIG. 3C, except that the first non-carbon based layer 205 has been removed. A second non-carbon based layer 220 is then deposited on the amorphous carbon layer 204 and the exposed substrate 202, and a photoresist 222 is deposited on the second non-carbon based layer 220, as shown in FIG. 4B. The photoresist 222 is patterned to include features 224, as shown in FIG. 4C. The features 224 patterned in the photoresist 222 are transferred to the amorphous carbon layer 204 and the non-carbon based layer 220 to creates feature 208 in the in the amorphous carbon layer 204 and the non-carbon based layer 220, and the photoresist 222 is removed, as shown in FIG. 4D. FIG. 4D substantially corresponds to FIG. 3E. The substrate 202 is then etched, as shown in FIG. 3F.

In the embodiments shown in FIGS. 2A–2F and 3A–3F, identical or substantially identical features are formed in an amorphous carbon layer that is patterned twice and used as a hardmask to pattern a substrate. Preferably, a first mask is used to form the first pattern in the amorphous carbon layer and a second mask is used to form the second pattern in the amorphous carbon layer.

EXAMPLE

A 550 Å amorphous carbon APF™ layer was deposited on a silicon substrate in a Producer® system. A 250 Å non-carbon based layer, a silicon oxynitride dielectric anti-reflective coating (DARC), was deposited on the amorphous carbon APF™ layer in the Producer® system. The amorphous carbon APF™ layer and the DARC layer had a reflectivity of less than 0.5% for 248 nm electromagnetic radiation. The DARC layer was coated with 2000 Å of TOK N850 negative-tone resist. The resist was pre-baked at 90° C. for 60 seconds. The resist was exposed with a Canon FPA-5000ES2 exposure tool at a NA of 0.68 and a σ of 0.3. The resist was post exposure baked at 110° C. for 90 seconds and then developed with 0.26 N tetramethyl ammonium hydroxide (TMAH) at 23° C. for 60 seconds. A side-wall chrome alternating aperture mask was used for the exposure. The pattern defined in the photoresist was transferred through the amorphous carbon layer in a DPS II chamber available from Applied Materials, Inc. Another layer of resist was deposited on the substrate and patterned as described above. The pattern in the photoresist was transferred through the amorphous carbon layer in a DPS II chamber. The patterns in the amorphous carbon layer were then transferred through the substrate in a DPS II chamber. The patterned substrate had 75 nm interconnects that were separated by a distance of 75 nm.

While the foregoing is directed to embodiments of the present invention, other and further embodiments of the invention may be devised without departing from the basic scope thereof, and the scope thereof is determined by the claims that follow.

What is claimed is:

1. A method of etching a substrate, comprising:
depositing an amorphous carbon layer on the substrate;
defining a first pattern in the amorphous carbon layer;
depositing a layer of photoresist on the amorphous carbon layer;
patterning the photoresist;
transferring the pattern in the photoresist through the amorphous carbon layer to form a second pattern in the amorphous carbon layer; and then
transferring the first and second patterns in the amorphous carbon layer through the substrate at the same time.

2. The method of claim 1, wherein the amorphous carbon layer is deposited by vapor deposition from a gas mixture comprising one or more hydrocarbons having the general formula $C_xH_y$, wherein x has a range of 2 to 4 and y has a range to 2 to 10.

3. The method of claim 1, wherein the substrate comprises a material selected from the group consisting of silicon, polysilicon, an oxide, a nitride, tungsten, tungsten silicide, aluminum, silicon oxycarbide, and combinations thereof.

4. The method of claim 1, further comprising depositing an anti-reflective coating layer selected from the group consisting of amorphous silicon, silicon nitride, silicon oxynitride, silicon oxide, doped silicon oxide, silicon oxycarbide, carbides, silicon carbide, titanium, and titanium nitride on the substrate before the depositing the amorphous carbon layer.

5. The method of claim 1, wherein the amorphous carbon layer is deposited at a power of between about 1 W/in$^2$ and about 100 W/in$^2$.

6. The method of claim 1, further comprising removing the amorphous carbon layer from the substrate after the first and second patterns in the amorphous carbon layer are transferred through the substrate.

7. A method of etching a substrate, comprising:
depositing an amorphous carbon layer on the substrate;
depositing a non-carbon based layer on the amorphous carbon layer;
defining a first pattern in the non-carbon based layer and in the amorphous carbon layer;
depositing a layer of photoresist on the non-carbon based layer after the first pattern is defined in the non-carbon based layer and in the amorphous carbon layer;
patterning the photoresist;
transferring the pattern in the photoresist through the non-carbon based layer and the amorphous carbon layer to form a second pattern in the amorphous carbon layer; and
transferring the first and second patterns in the amorphous carbon layer through the substrate at the same time.

8. The method of claim 7, wherein the amorphous carbon layer is deposited by vapor deposition from a gas mixture comprising one or more hydrocarbons having the general formula $C_xH_y$, wherein x has a range of 2 to 4 and y has a range to 2 to 10.

9. The method of claim 7, wherein the substrate comprises a material selected from the group consisting of silicon, polysilicon, an oxide, a nitride, tungsten, tungsten silicide, aluminum, silicon oxycarbide, and combinations thereof.

10. The method of claim 7, further comprising depositing an anti-reflective coating layer selected from the group consisting of amorphous silicon, silicon nitride, silicon oxynitride, silicon oxide, doped silicon oxide, silicon oxycarbide, carbides, silicon carbide, titanium, and titanium nitride on the substrate before the depositing the amorphous carbon layer.

11. The method of claim 7, wherein the amorphous carbon layer is deposited at a power of between about 1 W/in$^2$ and about 100 W/in$^2$.

12. The method of claim 7, wherein the non-carbon based layer is selected from the group consisting of amorphous silicon, silicon nitride, silicon oxynitride, silicon oxide, doped silicon oxide, silicon oxycarbide, carbides, silicon carbide, titanium, and titanium nitride.

13. The method of claim 12, wherein the non-carbon based layer has a thickness of between about 50 Å and about 500 Å.

14. The method of claim 7, further comprising removing the amorphous carbon layer and the non-carbon based layer from the substrate after the first and second patterns in the amorphous carbon layer are transferred through the substrate.

15. A method of etching a substrate, comprising:
depositing an amorphous carbon layer on the substrate;
depositing a first non-carbon based layer on the amorphous carbon layer;
defining a first pattern in the non-carbon based layer and in the amorphous carbon layer;
depositing a second non-carbon based layer over the amorphous carbon layer after the first pattern is defined in the amorphous carbon layer;
depositing a layer of photoresist on the second non-carbon based layer;
patterning the photoresist;
transferring the pattern in the photoresist through the second non-carbon based layer and the amorphous carbon layer to form a second pattern in the amorphous carbon layer; and
transferring the first and second patterns in the amorphous carbon layer through the substrate at the same time.

16. The method of claim 15, wherein the first non-carbon based layer is selected from the group consisting of amorphous silicon, silicon nitride, silicon oxynitride, silicon oxide, doped silicon oxide, silicon oxycarbide, carbides, silicon carbide, titanium, and titanium nitride.

17. The method of claim 16, wherein the first non-carbon based layer has a thickness of between about 50 Å and about 500 Å.

18. The method of claim 15, wherein the second non-carbon based layer is selected from the group consisting of amorphous silicon, silicon nitride, silicon oxynitride, silicon oxide, doped silicon oxide, silicon oxycarbide, carbides, silicon carbide, titanium, and titanium nitride.

19. The method of claim 15, wherein the amorphous carbon layer is deposited by vapor deposition from a gas mixture comprising one or more hydrocarbons having the general formula $C_xH_y$, wherein x has a range of 2 to 4 and y has a range to 2 to 10.

20. The method of claim 15, wherein the substrate comprises a material selected from the group consisting of silicon, polysilicon, an oxide, a nitride, tungsten, tungsten silicide, aluminum, silicon oxycarbide, and combinations thereof.

21. The method of claim 15, further comprising depositing an anti-reflective coating layer selected from the group consisting of amorphous silicon, silicon nitride, silicon oxynitride, silicon oxide, doped silicon oxide, silicon oxycarbide, carbides, silicon carbide, titanium, and titanium nitride on the substrate before the depositing the amorphous carbon layer.

22. The method of claim 15, wherein the amorphous carbon layer is deposited at a power of between about 1 W/in$^2$ and about 100 W/in$^2$.

23. The method of claim 15, further comprising removing the amorphous carbon layer and the second non-carbon based layer from the substrate after the first and second patterns in the amorphous carbon layer are transferred through the substrate.

* * * * *

UNITED STATES PATENT AND TRADEMARK OFFICE
CERTIFICATE OF CORRECTION

PATENT NO. : 7,064,078 B2 Page 1 of 1
APPLICATION NO. : 10/768724
DATED : June 20, 2006
INVENTOR(S) : Wei Liu et al.

It is certified that error appears in the above-identified patent and that said Letters Patent is hereby corrected as shown below:

On the title page:

Item [56], References Cited, U.S. PATENT DOCUMENTS: Please include the following reference:

6,403,291 B1        5/2001        Bula et al.

Column 5, Line 28: Delete the second instance of "in the"

Column 7, Line 7: Change "creates" to --create--

Column 7, Line 7: Delete the second instance of "in the"

Column 10, Claim 19, Line 7: Change "2to" to --2 to--

Signed and Sealed this

Twenty-fourth Day of October, 2006

JON W. DUDAS
*Director of the United States Patent and Trademark Office*